(12) United States Patent
Itoh

(10) Patent No.: US 8,268,396 B2
(45) Date of Patent: Sep. 18, 2012

(54) FILM FORMING METHOD AND APPARATUS, AND STORAGE MEDIUM

(75) Inventor: Hitoshi Itoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 520 days.

(21) Appl. No.: 12/568,142

(22) Filed: Sep. 28, 2009

(65) Prior Publication Data

US 2010/0015334 A1   Jan. 21, 2010

Related U.S. Application Data

(63) Continuation of application No. PCT/JP2008/054649, filed on Mar. 13, 2008.

(30) Foreign Application Priority Data

Mar. 30, 2007 (JP) ................... 2007-095162

(51) Int. Cl.
*C23C 16/00* (2006.01)

(52) U.S. Cl. .............. 427/248.1; 427/250; 427/252; 118/715; 118/719; 118/726

(58) Field of Classification Search .... 427/248.1–255.7; 118/715–733
See application file for complete search history.

(56) References Cited

U.S. PATENT DOCUMENTS

| 4,986,204 A * | 1/1991 | Yoshida .................... 114/61.14 |
| 5,104,695 A * | 4/1992 | Greer et al. ................. 427/250 |
| 5,234,862 A * | 8/1993 | Aketagawa et al. .......... 438/488 |
| 5,858,476 A * | 1/1999 | Siess ............................ 427/561 |
| 6,132,805 A * | 10/2000 | Moslehi ..................... 427/248.1 |
| 6,572,924 B1 * | 6/2003 | Halpin ..................... 427/255.28 |

FOREIGN PATENT DOCUMENTS

| JP | 2004-047644 | 2/2004 |
| JP | 2006-299294 | 11/2006 |

* cited by examiner

*Primary Examiner* — Timothy Meeks
*Assistant Examiner* — Mandy Louie
(74) *Attorney, Agent, or Firm* — Oblon, Spivak, McClelland, Maier & Neustadt, L.L.P.

(57) ABSTRACT

A method for film formation is provided that can significantly suppress the amount of a source gas consumed in the formation of a copper film on a substrate by supplying a gas of a metallic source material complex, for example, copper acetate, produced by the sublimation of a solid source material, as a source gas to the substrate to cause a chemical reaction of the source gas. A source gas produced by the sublimation of a solid source material is supplied into a processing chamber, and the source material is adsorbed as a solid onto an adsorption/desorption member within the processing chamber. Next, the source gas supply and exhaust are stopped, and the processing chamber is brought to the state of a closed space. Thereafter, the substrate is heated, and the source material is chemically reacted on the substrate to form a thin film on the substrate.

10 Claims, 9 Drawing Sheets

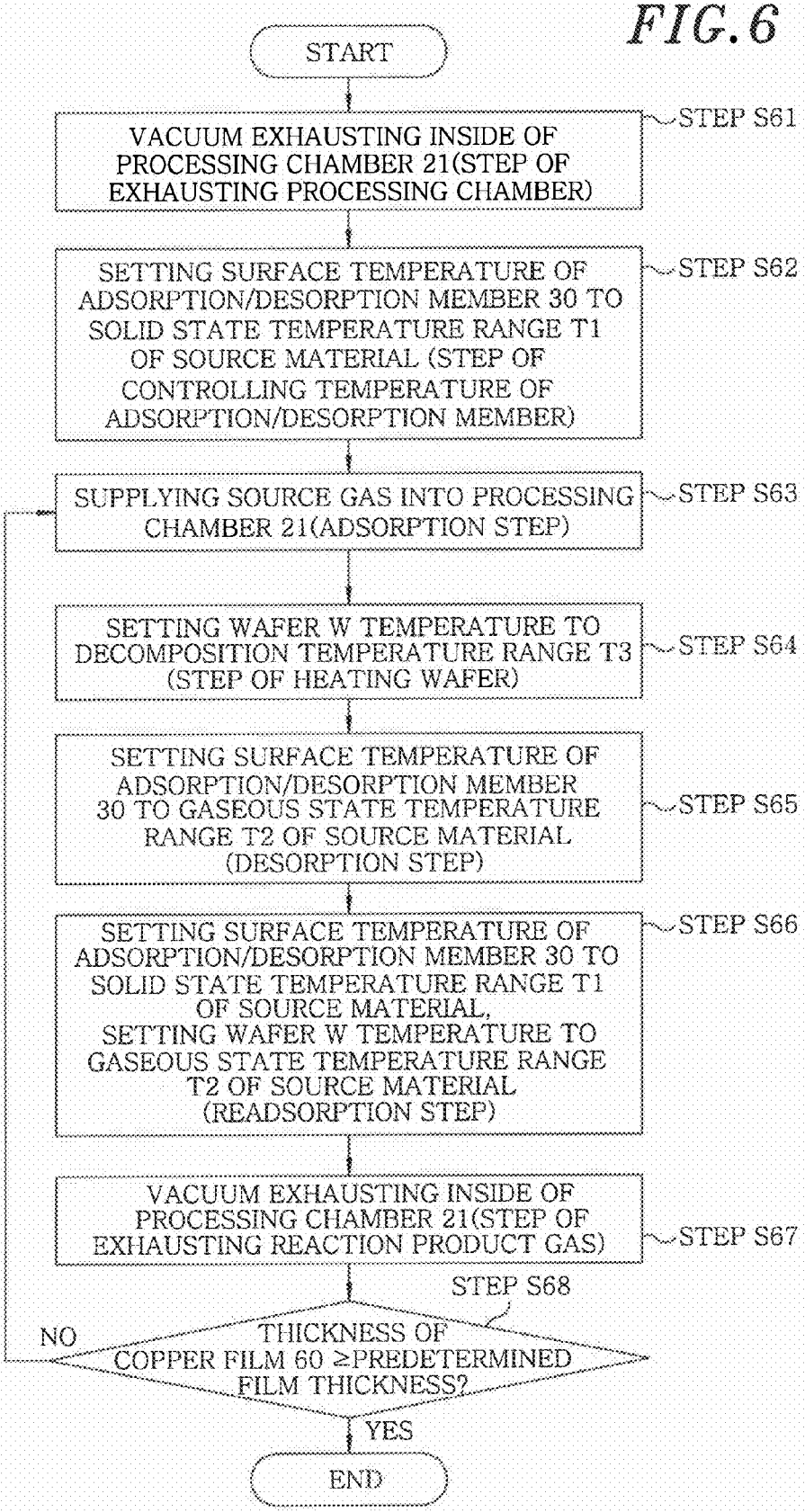

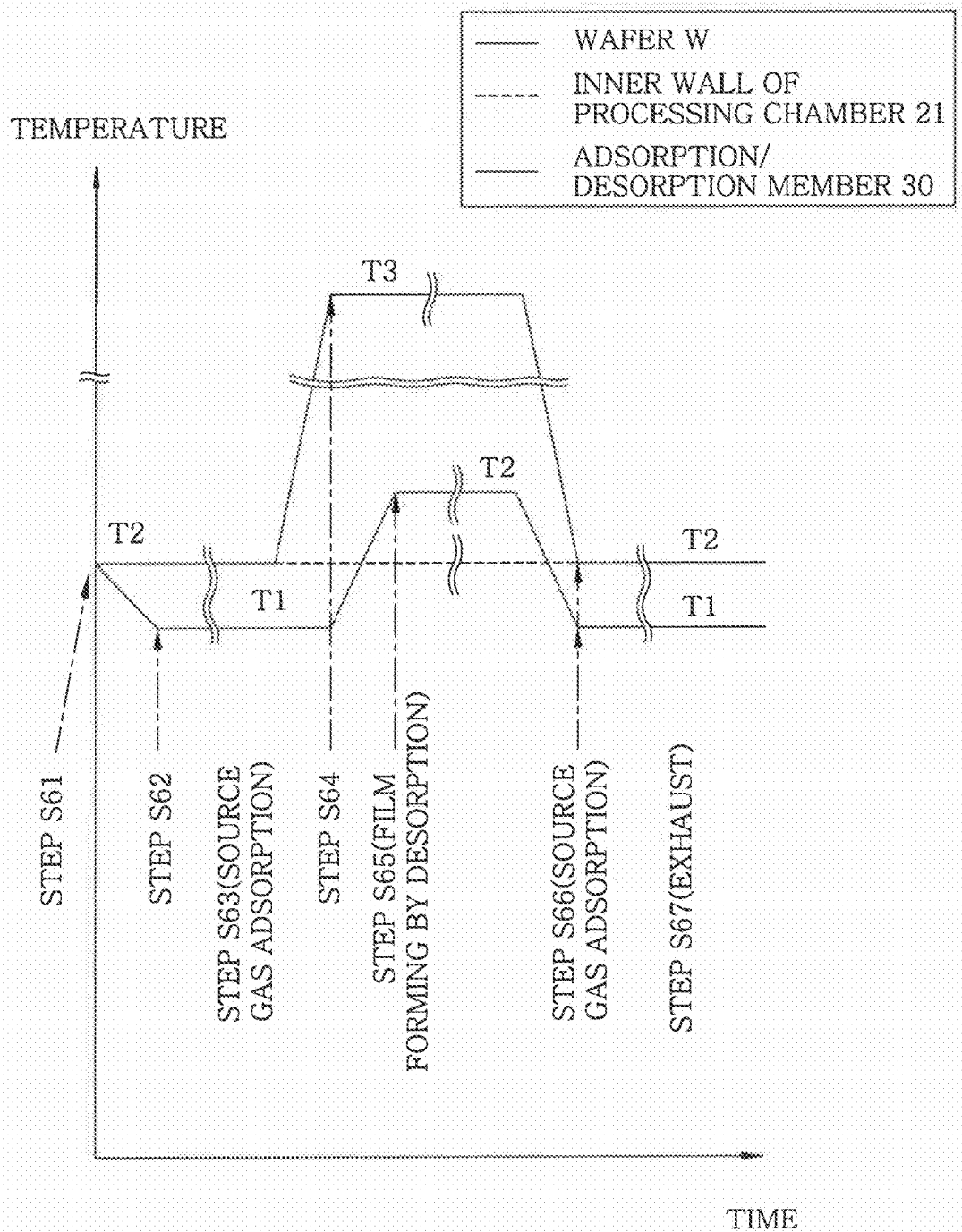

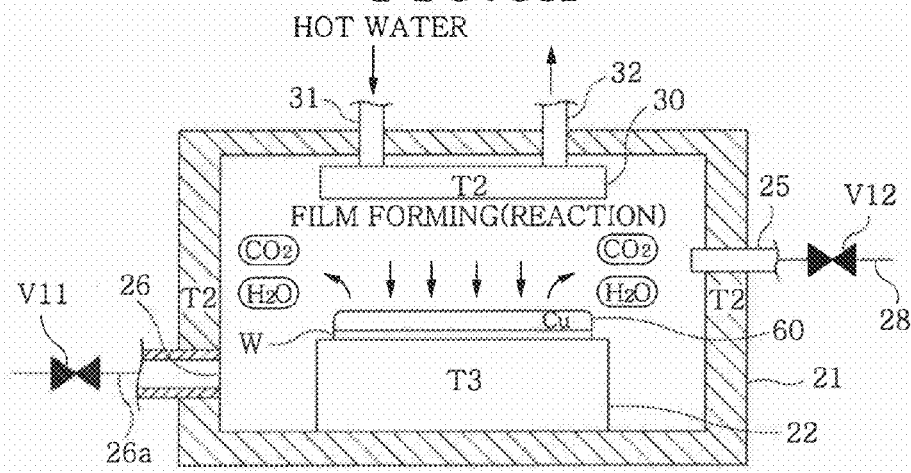
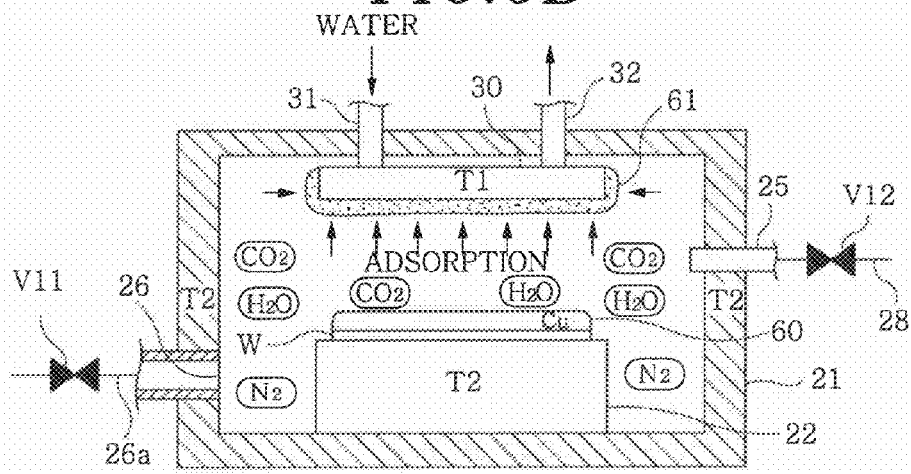
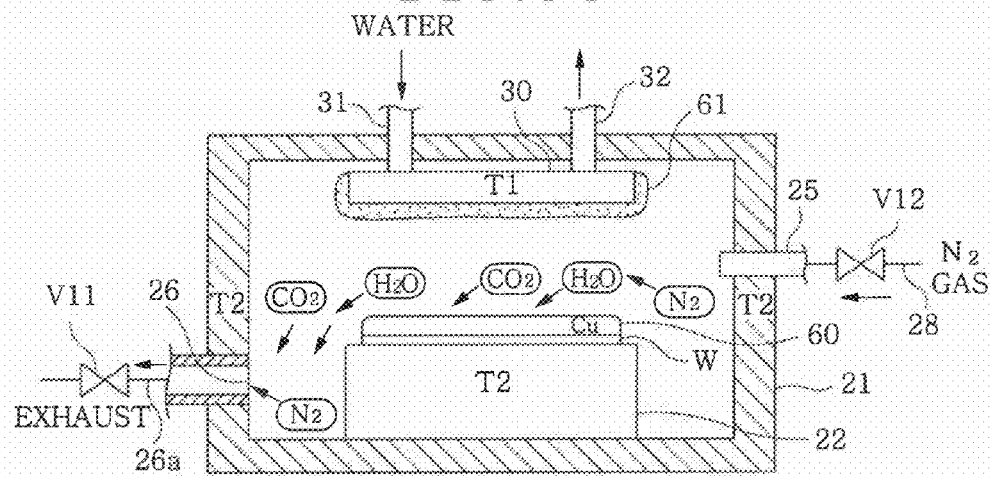

FILM FORMING METHOD AND APPARATUS, AND STORAGE MEDIUM

This application is a Continuation Application of PCT International Application No. PCT/JP2008/054649 filed on Mar. 13, 2008, which designated the United States.

FIELD OF THE INVENTION

The present invention relates to a technique for forming a thin film by causing a chemical reaction of a source gas on a substrate.

BACKGROUND OF THE INVENTION

There has been used a plating method for forming wiring on a substrate. However, since an opening dimension of a wiring groove or hole formed on a substrate becomes smaller to meet the recent demands for high integration of devices, plating solution cannot be supplied into the opening in the conventional plating method so that it makes difficulty in forming wiring.

Hence, there has been examined a method for forming wiring by a CVD (Chemical Vapor Deposition) method described in, e.g., Patent Document 1, instead of the plating method. In this method, a metal film is formed by causing a chemical reaction of a source gas on a substrate, the source gas being produced by sublimating a liquid source material of, e.g., metallic organic complex. Similarly, in the case of using a solid source material, a solid source material is sublimated to produce a source gas. Further, in this method, in order to form a film with high in-plane uniformity, the film formation is performed in a processing chamber while maintaining the processing chamber in a vacuum state by exhausting therein. Moreover, the source gas is used in a state of being diluted to ppm-levels with, e.g., Ar gas or the like.

In the vacuum state, a source gas concentration and a film forming rate decrease. In order to increase a throughput of the film formation, the film forming rate needs to be increased, and this requires a large supply amount of the source gas. Since, however, most of the source gas is exhausted, the use efficiency of the source gas that contributes to the film formation is only a few percent. The unnecessary waste of large amount of the source material is cost-ineffective due to its high cost, and hinders effective utilization of the source material.

Further, the CVD apparatus requires a high-volume vacuum pump capable of exhausting a large amount of source gas despite that such vacuum pump is considerably high-priced. Moreover, a large exhaust amount of the source gas that produces deposits or products accelerates deterioration of the vacuum pump by the source gas, which increase the maintenance cost. For such reasons, there is required a film forming apparatus capable of reducing waste of a source material and performing cost-effective film formation.

Patent Document 2 describes a technique for liquefying a source gas on a substrate. However, this technique cannot solve the problems of the present invention.

Patent Document 1: Japanese Patent Laid-open Publication No. 2006-299294 ((0021)-(0026))

Patent Document 2: Japanese Patent Laid-open Publication No. 2004-047644 ((0024)-(0028))

SUMMARY OF THE INVENTION

In view of the above, it is an object of the present invention to provide a technique capable of suppressing a consumption amount of a source gas consumed by increasing efficiency of film formation performed by causing a chemical reaction of the source gas on a substrate.

The present invention provides a film forming method for forming a thin film on a substrate by causing a chemical reaction of a source gas produced from a solid or a liquid source material on a surface of a substrate in a processing chamber by using a film forming apparatus including a processing chamber having a supply port for supplying the source gas and a exhaust port for exhausting a gas, a mounting table which is disposed in the processing chamber and mounts thereon the substrate, and an adsorption/desorption member for adsorbing and desorbing the source gas by changing a surface temperature thereof.

The film forming method includes the steps of: (a) setting a temperature of an inner wall of the processing chamber higher than or equal to a temperature TA at which the source material is sublimated or evaporated and lower than a temperature TB at which a chemical reaction takes place on the surface of the substrate; (b) setting a surface temperature of the adsorption/desorption member lower than the temperature TA, supplying the source gas into the processing chamber through the supply port while closing the exhaust port, and adsorbing the source gas in a solid or a liquid state onto the surface of the adsorption/desorption member while closing the supply port; (c) setting a temperature of the substrate mounted on the mounting table in the processing chamber higher than or equal to the temperature TB, setting the surface temperature of the adsorption/desorption member higher than or equal to the temperature TA, and causing a chemical reaction of the source gas desorbed from the surface of the adsorption/desorption member on the surface of the substrate to form a film on the substrate; and (d) replacing the source gas in the processing chamber with a purge gas.

The present invention provides the film forming method including, before the step (b), a step of mounting the substrate on the mounting table in the processing chamber and setting a temperature of the substrate higher than or equal to the temperature TA and lower than the temperature TB.

The present invention provides the film forming method including, after the step (d), a step (d1) of setting the temperature of the substrate higher than or equal to the temperature TA and lower than the temperature TB, wherein one or more cycles including the step (b), the step (c), the step (d) and the step (d1) are repeated.

The present invention provides the film forming method including, between the step (c) of film formation and the step (d) of replacement, a step of setting the surface temperature of the adsorption/desorption member lower than the temperature TA and adsorbing unreacted source gas in the processing chamber in a solid or a liquid state onto the adsorption/desorption member.

The present invention provides the film forming method, wherein the source gas is supplied into the processing chamber together with one or more carrier gases selected from argon, nitrogen, hydrogen.

The present invention provides a film forming apparatus for forming a thin film on a substrate by causing a chemical reaction of a source gas produced from a solid or a liquid source material on a surface of the substrate.

The film forming apparatus includes: a processing chamber having a supply port for supplying the source gas and an exhaust port for exhausting a gas; an adsorption/desorption member for adsorbing and desorbing the source gas by changing a surface temperature thereof; a first temperature control unit for setting a temperature of an inner wall of the processing chamber; a second temperature control unit for setting a temperature of the substrate in the processing chamber; a third temperature control unit for setting a temperature of a surface of the adsorption/desorption member; a purge gas supply unit for supplying a purge gas into the processing chamber; and a control unit for controlling the film forming apparatus.

Herein, the control unit performs: setting a temperature of an inner wall of the processing chamber higher than or equal to a temperature TA at which the source material is sublimated or evaporated and lower than a temperature TB at which a chemical reaction occurs on the surface of the substrate by the first temperature control unit; setting a surface temperature of the adsorption/desorption member lower than the temperature TA by the third temperature control unit, supplying the source gas into the processing chamber through the supply port while closing the exhaust port, and adsorbing the source gas in a solid or a liquid state onto the surface of the adsorption/desorption member while closing the supply port; setting a temperature of the substrate mounted on the mounting table in the processing chamber higher than or equal to the temperature TB by the second temperature control unit, setting the surface temperature of the adsorption/desorption member higher than or equal to the temperature TA and lower than the temperature TB by the third temperature control unit, and causing a chemical reaction of the source gas desorbed from the surface of the adsorption/desorption member on the surface of the substrate to form a film on the substrate; and replacing the source gas in the processing chamber with a purge gas.

The present invention provides the film forming apparatus, wherein the control unit performs mounting the substrate on the mounting table in the processing chamber before the source gas is adsorbed onto the surface of the adsorption/desorption member, and outputs a control signal to set the temperature of the substrate higher than or equal to the temperature TA and lower than the temperature TB by the second temperature control unit.

The present invention provides the film forming apparatus, wherein the control unit performs to repeat, after the thin film is formed, one or more cycles including: setting the temperature of the substrate higher than or equal to the temperature TA and lower than the temperature TB by the second temperature control unit, setting the surface temperature of the adsorption/desorption member lower than the temperature TA by the third temperature control unit, supplying the source gas into the processing chamber through the supply port while closing the exhaust port, adsorbing the source gas in a solid or a liquid state onto the surface of the adsorption/desorption member while closing the supply port, setting a temperature of the substrate mounted on the mounting table in the processing chamber higher than or equal to the temperature TB by the second temperature control unit, setting the surface temperature of the adsorption/desorption member higher than or equal to the temperature TA and lower than the temperature TB by the third temperature control unit, causing a chemical reaction of the source gas desorbed from the surface of the adsorption/desorption member on the surface of the substrate to form a thin film on the substrate, and replacing the source gas in the processing chamber with a purge gas.

The present invention provides the film forming apparatus, wherein the control unit performs, between the thin film formation and the replacement of the source gas with the purge gas, setting the surface temperature of the adsorption/desorption member lower than the temperature TA by the third temperature control unit to adsorb unreacted source gas in the processing chamber in a solid or a liquid state onto the adsorption/desorption member.

The present invention provides a storage unit which stores therein a computer program for driving a computer to perform a film forming method for forming a thin film on a substrate by causing a chemical reaction of a source gas produced from a solid or a liquid source material on a surface of a substrate in a processing chamber by using a film forming apparatus including a processing chamber having a supply port for supplying the source gas and a exhaust port for exhausting a gas, a mounting table which is disposed in the processing chamber and mounts thereon the substrate, and an adsorption/desorption member for adsorbing and desorbing the source gas by changing a surface temperature thereof.

The film forming method includes the steps of: (a) setting a temperature of an inner wall of the processing chamber higher than or equal to a temperature TA at which the source material is sublimated or evaporated and lower than a temperature TB at which a chemical reaction takes place on the surface of the substrate; (b) setting a surface temperature of the adsorption/desorption member lower than the temperature TA, supplying the source gas into the processing chamber through the supply port while closing the exhaust port, and adsorbing the source gas in a solid or a liquid state onto the surface of the adsorption/desorption member while closing the supply port; (c) setting a temperature of the substrate mounted on the mounting table in the processing chamber higher than or equal to the temperature TB, setting the surface temperature of the adsorption/desorption member higher than or equal to the temperature TA, and causing a chemical reaction of the source gas desorbed from the surface of the adsorption/desorption member on the surface of the substrate to form a film on the substrate; and (d) replacing the source gas in the processing chamber with a purge gas.

In the present invention, in order to form a film by causing a chemical reaction of the source gas on the wafer, the source gas is supplied into the processing chamber and is adsorbed in a solid or a liquid state onto the adsorption/desorption member in the processing chamber. Next, the supply and the exhaust of the source gas in the processing chamber are stopped, and the processing chamber becomes a sealed space. Thereafter, the substrate is heated to a temperature at which the source gas chemically reacts, and the source material is desorbed from the adsorption/desorption member.

Accordingly, the film formation is performed at a proper temperature in the processing chamber, which is the sealed space where a large amount (high concentration) of source gas is uniformly diffused and, further, a thin film having no impurities can be obtained at a high film forming rate. In addition, the supply and the exhaust of the source gas are stopped during the film formation, and the source gas is adsorbed onto the adsorption/desorption member before exhausting a reaction product gas produced by the chemical reaction. Hence, the use efficiency of the source material increases considerably, and the high-priced source gas can be effectively used. Besides, a film thickness of a film formed by a single film forming process can be controlled with high accuracy by controlling an adsorption amount of the source material onto the adsorption/desorption member. Further, a film thickness of a thin film can be controlled with high accuracy by controlling a film thickness obtained by a single film forming cycle process and a number of repetitions of the film forming cycle.

BRIEF DESCRIPTION OF THE DRAWINGS

FIG. 6 represents a flowchart describing an example of the film forming method.

FIG. 7 offers characteristic curves of temperatures of a wafer and the like during processes of the film forming method.

FIGS. 9A to 9C show cross sectional views of the processing chamber during the processes of the film forming method.

DETAILED DESCRIPTION OF THE EMBODIMENT

Figure 1:
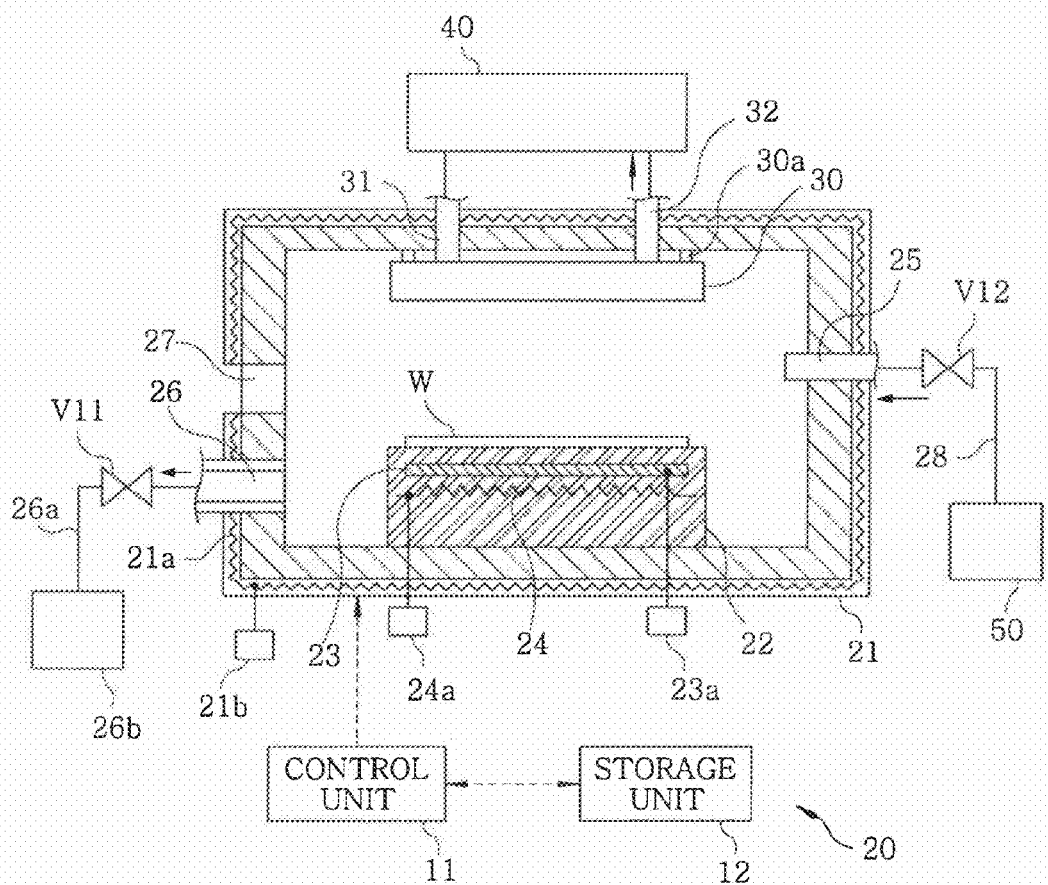
FIG. 1 is a vertical cross sectional view showing an example of a film forming apparatus for performing a film forming method in accordance with the present invention.

A film forming apparatus 20 for performing the film forming method in accordance with the present invention will be explained with respect to FIGS. 1 to 4. The film forming apparatus 20 includes a processing chamber 21 and a mounting table 22 provided at a lower portion of the processing chamber 21. The processing chamber 21 is provided with a heater 21a serving as a first temperature control unit for controlling a temperature of an inner wall of the processing chamber 21, and the heater 21a is connected to a power supply 21b.

An electrostatic chuck 23 for electrostatically attracting and holding a substrate, e.g., a semiconductor wafer (hereinafter, referred to as a "wafer W"), is buried in the mounting table 22, and is connected to a power supply 23a. The mounting table 22 is provided with a heater 24 serving as a second temperature control unit for controlling a temperature of the wafer W, and the heater 24 is connected to a power supply 24a. Moreover, the heater 24 controls a temperature of a side surface of the mounting table 22. Although the heater 24 is buried in the mounting table 22 in this example, it is also possible to provide, e.g., a halogen lamp, at an upper and/or a lower portion of the processing chamber 21 to thereby control the temperature of the wafer W via a light transmitting window (not shown) disposed on a ceiling wall and/or a bottom surface of the processing chamber 21. In that case, the temperature of the wafer W is controlled more quickly.

Figure 2:
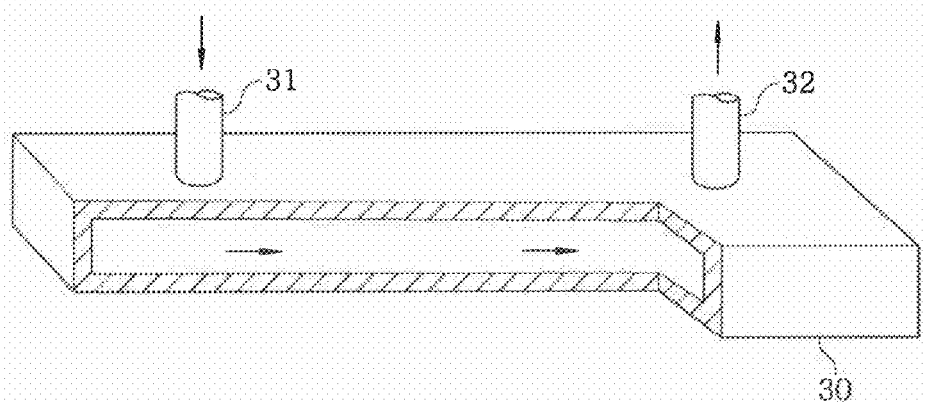
FIG. 2 provides a perspective view showing an example of an adsorption/desorption member provided in the film forming apparatus.

Supported on the ceiling wall of the processing chamber 21 via supports 30a is an adsorption/desorption member 30 for adsorbing or desorbing vapor of carboxylic acid of copper, e.g., copper acetate, as a source gas for forming a metal film, e.g., a copper film, on the wafer W. The adsorption/desorption member 30 is made of, e.g., a high thermal conductive material, e.g., aluminum, and has a hollow inner space, as shown in FIG. 2. Connected to the adsorption/desorption member 30 are a temperature control medium supply line 31 and a temperature control medium exhaust line 32 which form a temperature control medium circulation path for circulating a temperature control medium to be described later. The temperature control medium supply line 31 and the temperature control medium exhaust line 32 are connected to a temperature control mechanism 40 serving as a third temperature control unit through the ceiling wall of the processing chamber 21.

The temperature control mechanism 40 is configured to quickly increase and decrease a temperature of the adsorption/desorption member 30 between a low temperature, e.g., about 50° C., and a high temperature, e.g., about 90° C. In other words, in the temperature control mechanism 40, the temperature control medium selected between high-temperature fluid (e.g., hot water) and low-temperature fluid (e.g., water), circulates inside the adsorption/desorption member 30 by switching valves Va and Vb to be described later. In order to switch the supply of hot water and that of water, the fluid (water or hot water) filling in the adsorption/desorption member 30 can be discharged by supplying, e.g., air, into the adsorption/desorption member 30.

Figure 3:
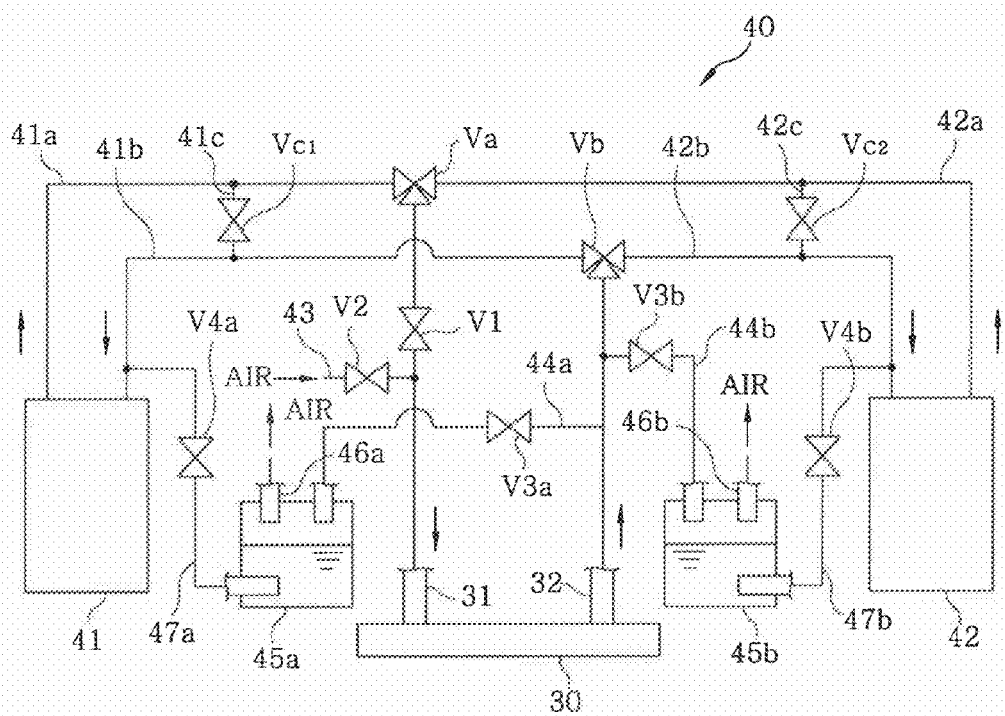
FIG. 3 describes an example of a temperature control mechanism provided in the film forming apparatus.

To be specific, the temperature control mechanism 40 includes a low temperature controller 41 and a high temperature controller 42, as illustrated in FIG. 3. Each of the low temperature controller 41 and the high temperature controller 42 has a temperature control unit, e.g., a heater or the like, so that the temperatures of hot water and water circulating therein can be maintained at about 50° C. and about 90° C., respectively.

The low temperature controller 41 is connected to a low-temperature fluid supply line 41a for supplying the water and a low-temperature fluid discharge line 41b for discharging the water. The low-temperature fluid supply line 41a and the low-temperature fluid discharge line 41b are connected to the temperature control medium supply line 31 and the temperature control medium discharge line 32 via the valves Va and Vb, respectively. Moreover, the high temperature controller 42 is connected to a high-temperature fluid supply line 42a for supplying hot water and a high-temperature fluid discharge line 42b for discharging hot water. The high-temperature fluid supply line 42a and the high-temperature fluid discharge line 42b are connected to the valves Va and Vb, respectively.

As described above, the supply of water and that of hot water to the adsorption/desorption member 30 can be switched by switching the valves Va and Vb. For clarity, the low-temperature fluid supply line 41a, the low-temperature fluid discharge line 41b, the high-temperature fluid supply line 42a, the high-temperature fluid discharge line 42b, the temperature control medium supply line 31, and the temperature control medium discharge line 32 are indicated by bold lines in FIG. 3.

In addition, bypass lines 41c and 42c are provided between the low-temperature fluid supply line 41a and the low-temperature fluid discharge line 41b and between the high-temperature supply line 42a and the high-temperature fluid discharge line 42b, respectively. While one fluid of the water and the hot water is supplied into the adsorption/desorption member 30, a valve Vc1 or Vc2 may be opened so that the other fluid circulates in the low temperature controller 41 or the high temperature controller 42 without being stagnant therein.

An exhaust gas supply line 43 for supplying a gas, e.g., air, used for discharging a temperature control medium is connected via a valve V2 to the temperature control medium supply line 31 disposed at a downstream side of the valve Va (the adsorption/desorption member 30 side). A valve V1 is provided in the temperature control medium supply line 31 disposed between the valve Va and the exhaust gas supply line 43.

The temperature control medium discharge line 32 is connected to gas exhaust lines 44a and 44b. Thus, in the case of discharging the temperature control medium from the adsorption/desorption member 30 by supplying air from the exhaust gas supply line 43 into the adsorption/desorption member 30, the gas exhaust lines can be switched depending on whether the temperature control medium in the adsorption/desorption member 30 is water or hot water.

A liquid collecting unit 45a is connected to a downstream side of the gas exhaust line 44a, and an opening of the gas exhaust port 46a is formed at a position above a liquid surface of water in the liquid collecting unit 45a so that water and air discharged from the gas exhaust line 44a are separated from each other in the liquid collecting unit 45a. The water returns from the liquid collecting unit 45a to the low-temperature fluid discharge line 41b via a return line 47a. In the same manner, a liquid collecting unit 45b, a gas exhaust line 46b and a return line 47b are provided at a downstream side of the gas exhaust line 44b, so that hot water and air are separated from each other. In addition, notations V3a, V3b, V4a and V4b in the drawings denote valves.

Hereinafter, the film forming apparatus 20 will be described with reference to FIG. 1 again. Formed on a sidewall of the processing chamber 21 is a supply port 25 for supplying a source gas produced by sublimation of a solid source material, e.g., copper acetate, into the processing chamber 21. An exhaust port 26 for exhausting the atmosphere in the processing chamber 21 opens at opposite side of the supply port 25. Moreover, a transfer port 27 for transferring a wafer W is formed at the processing chamber 21, and is configured to be opened and closed by a gate valve (not shown). The exhaust port 26 is connected to an exhaust line 26a in which a valve V11 is installed, and the exhaust line 26a is connected to a vacuum exhaust unit 26b, e.g., a vacuum pump or the like. The supply port 25 is connected to a source material supply line 28 in which a valve V12 is installed, and the source material supply line 28 is connected to a source material supply unit 50.

Figure 4:
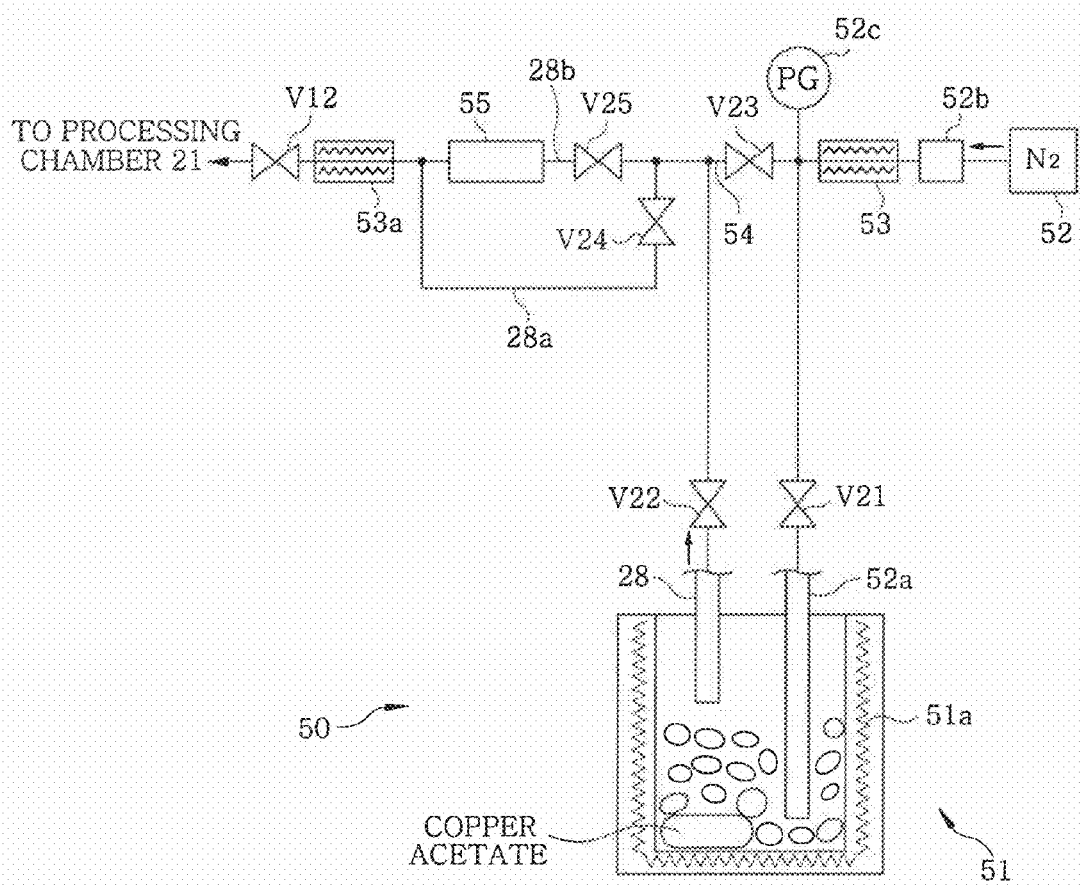
FIG. 4 depicts an example of a source material supply unit provided in the film forming apparatus.

As shown in FIG. 4, the source material supply unit 50 includes a source material container 51 containing a particle-shaped solid source material, e.g., copper acetate, and a carrier gas source 52 for supplying a carrier gas, e.g., nitrogen gas, into the source material container 51. The source material container 51 is provided with a heating unit 51a for heating a solid source material in the source material container 51, so that the solid source material can be heated to a temperature up to, e.g., 100° C. at which the source material is sublimated. A carrier gas supply line 52a and a source material supply line 28 for exhausting a source gas produced by sublimating the source material from the source material container 51 together with a carrier gas open inside the source material container 51. The carrier gas is not limited to nitrogen gas, and may also be a rare gas such as Ar gas or the like, hydrogen gas or the like. Or, one or more gases selected therefrom can be used.

Provided at an upstream side (the source material container 51 side) of the valve V12 of the source material supply line 28 is a heating unit 53a for heating a gas flowing in the source material supply line 28. Between the source material container 51 and the processing chamber 21, the source material supply line 28 branches into a bubbling line 28a and a baking line 28b. As will be described hereinafter, the bubbling line 28a is used to supply the source gas from the source material container 51 into the processing chamber 21 together with the carrier gas. The baking line 28b is used to supply only the source gas, but not the carrier gas, from the source material container 51.

The carrier gas source 52 is connected to an upstream side of the carrier gas supply line 52a connected to the source material container 51 via a valve V21 and a flow rate control unit 52b including a mass flow controller and a valve. The carrier gas supply line 52a is provided with a heating unit 53, which serves to heat a carrier gas flowing in the carrier gas supply line 52a to, e.g., 100° C., to sublimate the solid copper acetate in the source material container 51, and a pressure measurement unit 52c, e.g., a pirani gauge or the like, to measure a pressure of the carrier gas.

A flow rate control unit 55 is installed in the baking line 28b. When the carrier gas is used, a flow rate of the carrier gas is controlled by the flow rate control unit 52b. When the carrier gas is not used, a flow rate of the source gas is controlled by the flow rate control unit 55.

Further, a bypass line 54 is provided between the carrier gas supply line 52a and the source material supply line 28, and a valve V23 is installed in the bypass line 54. The carrier gas source 52, the bypass line 54, the valve V23, and the source material supply line 28 correspond to a purge gas supply unit.

Moreover, a flow path (the source material supply line 28, the bubbling line 28a and the baking line 28b), which is disposed at the downstream side thereof with respect to the source material container 51 and allows the source gas (gaseous copper acetate) to flow therein, has a large cross sectional area so that condensation of the source gas can be suppressed. Further, a heating unit, e.g., a tape heater or the like, is installed in the above flow path, however, the illustration thereof is omitted here. Furthermore, the bubbling line 28a and the baking line 28b are provided with gas exhaust lines which exhaust the source gas when the valve V12 is closed. However, the illustration thereof is also omitted here. The notations V22, V24 and V25 in the drawing denote valves.

The film forming apparatus 20 is provided with a control unit 11 constituted by, e.g., a computer. The control unit 11 has a data processing unit having a program, a memory and a CPU, and the like. The program contains commands for sending control signals to respective components of the film forming apparatus 20 from the control unit 11 and executing each processing step to be described later to thereby carry out the film forming process on the wafer W or the transfer of the wafer W.

Further, for example, the memory has a region in which process parameters such as a temperature of the wafer W or the temperature control medium, processing time, a gas flow rate and the like are stored. When the CPU executes the respective commands of the program, these process parameters are read out, and the control signals in accordance with the read-out parameters are sent to the respective components of the film forming apparatus 20. The program (including a program related to an input manipulation or display of the processing parameters) is installed in a control unit 11 after being stored in a storage unit 12, e.g., a computer storage medium such as a flexible disk, a compact disk, an MO (magneto-optical disk), a hard disk or the like.

Figure 5:
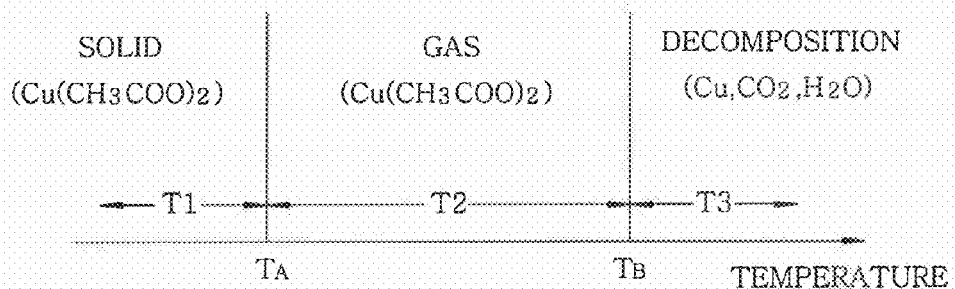
FIG. 5 presents a schematic view showing a property change of copper acetate as an example of a source material used in the film forming method in accordance with the present invention.

Hereinafter, the property of copper acetate as a source material used for the film forming method will be explained with reference to FIG. 5. This source material is characterized in that it is sublimated when heated to a temperature higher than or equal to a temperature TA, e.g., 50° C., and is decomposed by a chemical reaction when heated to a temperature higher than or equal to a temperature TB, e.g., 150° C. This source material is in a solid state at a temperature lower than 50° C., and changes its property to gas at a temperature between 50° C. and 150° C. Moreover, it is decomposed at a temperature higher than 150° C. by the following chemical reaction, thereby producing copper, carbon dioxide and water.

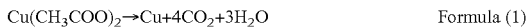
$$Cu(CH_3COO)_2 \rightarrow Cu + 4CO_2 + 3H_2O \qquad \text{Formula (1)}$$

In the following description, a temperature range, which is lower than the temperature TA and allows the source material to be in a solid state, is denoted as T1; a temperature range, which is higher than the temperature TB and allows the source material to be decomposed, is denoted as T3; and a temperature range, which is between the temperature TA and the temperature TB and allows the source material to be in a gaseous state, is denoted as T2.

In this example, copper acetate is used as an example of a source material. However, the source material is not limited thereto, and any copper compound may be used as long as its property changes from a solid state to a gaseous state and then to a decomposed state (film formation/chemical reaction) with an increase in a temperature. Further, the compound is not limited to one whose property changes from a solid state to a gaseous state directly, and may be one whose property changes from a solid state to a liquid state and then to a gaseous state. The temperature ranges T1 to T3 are set depending on types of compounds.

Moreover, the source material may be in a liquid state instead of a solid state in the temperature range T1 as long as the source material in the temperature range T1 has a smaller volume than that of the source material in the gaseous state in the temperature range T2 so that the source material can be condensed and adsorbed onto the adsorption/desorption member 30. In such case, T1 represents a temperature range in which the source material is in a solid and a liquid phase. Therefore, in this specification, the term "sublimation" may be replaced with the term "condensation".

Further, a film to be formed is not limited to a copper metal film, and may be another metal film, a compound film or the like. In the following description, the temperature ranges T1 to T3 and the temperatures TA and TB are higher than or equal to a room temperature, so that the term "heating" is sometimes used in relation to temperature control. However, when they are lower than the room temperature depending on types of materials used, the term "heating" may be replaced with the term "cooling".

Hereinafter, the film forming method of the present invention will be explained with reference to FIGS. 6 to 9.

(Step S61: Step of Exhausting the Processing Chamber)

First of all, the inside of the processing chamber 21 is depressurized to a predetermined vacuum level, e.g., 100 Pa, via the exhaust line 26a by the vacuum exhaust unit 26b, and then the valve V11 is closed.

Further, the inner wall of the processing chamber 21, the wafer W, and the surface of the mounting table 22 are heated to a temperature of, e.g., 70° C. within the gaseous state temperature range T2 of the source gas by the heaters 21a and 24, as shown in FIG. 7. In the following steps as well, the temperature of the inner wall of the processing chamber 21 is set to a temperature within the gaseous state temperature range T2, so that the description thereof will be omitted. Referring to FIG. 7, in the step S61, the temperature of the surface of the adsorption/desorption member 30 is within the gaseous state temperature range T2. However, it may be within the solid state temperature range T1.

Further, in the above described step S61, the temperatures of the inner wall of the processing chamber 21, the wafer W, and the mounting table 22 are set to be a lower temperature in the gaseous state temperature range T2 to minimize the possibility of thermal decomposition of the source gas on the inner wall of the processing chamber 21 and the like.

(Step S62: Step of Controlling a Temperature of the Adsorption/Desorption Member)

Figure 8A:
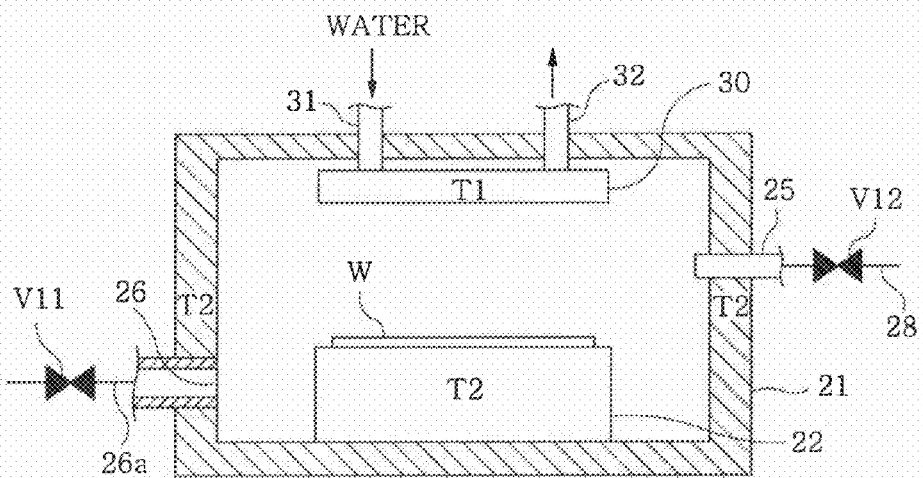
FIGS. 8A to 8C illustrate cross sectional views of the processing chamber during the processes of the film forming method.

Next, as illustrated in FIGS. 7 and 8A, the temperature of surface of the adsorption/desorption member 30 is set to a temperature lower than, e.g., 50° C. within the solid state temperature range T1 of the source material by supplying water of a temperature lower than, e.g., 50° C., from the low temperature controller 41 into the adsorption/desorption member 30. At this time, if the temperature of the surface of the adsorption/desorption member 30 has been set to a temperature of, e.g., 90° C. within the temperature range T2 by the hot water, the hot water in the adsorption/desorption member 30 can be exhausted to the liquid collecting unit 45b by supplying, e.g., air, from the exhausting gas supply line 43 into the adsorption/desorption member 30 so that the surface of the adsorption/desorption member 30 is cooled down to a temperature within the temperature range T1 in a short period of time, for example, within one minute. In the following steps as well, the temperature of the adsorption/desorption member 30 is quickly controlled by discharging the temperature control medium by supplying air. In FIGS. 8 and 9, a closed and an open state of the valves V11 and V12 are indicated by black and white valves, respectively.

(Step S63: Adsorption Step)

A carrier gas of, e.g., 100° C. is supplied from the carrier gas source 52 into the source material container 51 at a predetermined flow rate of, e.g., 100 to 500 sccm, and a predetermined pressure of, e.g., $10^5$ Pa (atmospheric pressure). The temperature of the source material in the source material container 51 reaches a temperature of, e.g., 90° C. within the gaseous state temperature range T2 by a heat from the carrier gas and a heat from the heating unit 51a provided at the source material container 51, so that the property thereof changes from solid to gas by sublimation. The sublimated source material is supplied as a source gas into the processing chamber 21 together with the carrier gas via the source material supply line 28 and the bubbling line 28a.

The source gas is supplied into the processing chamber 21 for a predetermined period of time, e.g., 60 seconds. At this time, the temperature of the source gas is also accurately controlled by the heating unit 53a.

Figure 8B:
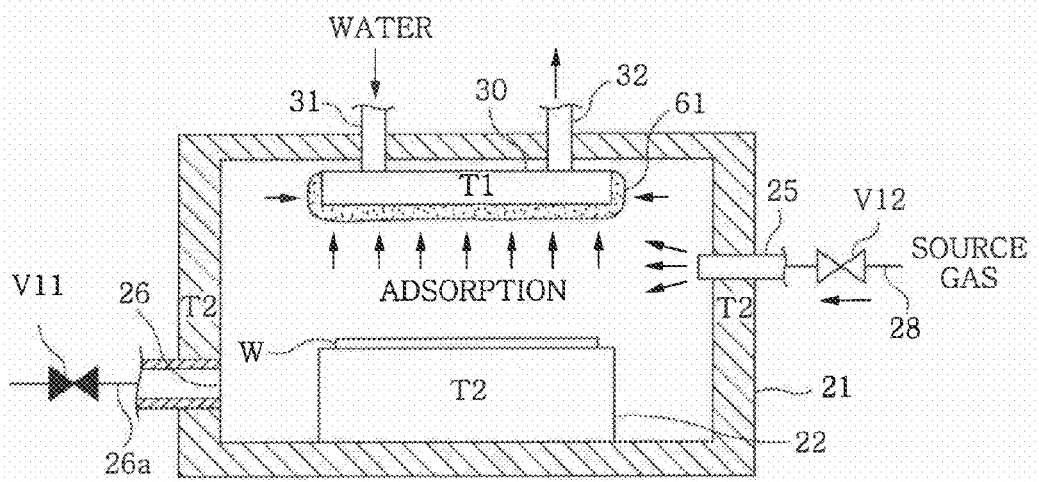

As shown in FIG. 8B, the source gas supplied into the processing chamber 21 is diffused into the depressurized processing chamber 21. Since, however, the temperature of the surface of the adsorption/desorption member 30 is set to a temperature lower than, e.g., 50° C. within the solid state temperature range T1, the source gas is sublimated and adsorbed onto the adsorption/desorption member 30, which results in formation of an adsorption film 61. Due to the adsorption of the source material, the concentration of the source gas near the adsorption/desorption member 30 decreases. Accordingly, the source gas in the processing chamber 21 flows toward the adsorption/desorption member 30, and is gradually sublimated and adsorbed thereonto.

The source gas is adsorbed onto the entire surface of the adsorption/desorption member 30. However, in order to simplify the illustration, FIGS. 8A and 9C show that the source gas is adsorbed onto one side (the side facing the wafer W) of the adsorption/desorption member 30. Besides, although the wafer W is already loaded into the processing chamber 21 in a step S61, the wafer W may be loaded into the processing chamber 12 between this step and a next step S64. Especially, when the wafer W is loaded between the step S63 and the step S64, the adhesion of residual source material or source gas to the wafer W is prevented.

The source gas is supplied into the processing chamber 21 that is vacuum-exhausted in the step S61. However, the source gas may be supplied into the processing chamber 21 in the atmospheric pressure. In that case, the atmosphere in the processing chamber 21 may be exhausted through, e.g., the exhaust line 26a, so as to prevent a pressure in the processing chamber 21 from becoming a positive pressure. Or, the following steps may be performed while maintaining the positive pressure therein.

(Step S64: Step of Heating the Wafer)

Next, as depicted in FIG. 7, the wafer W is heated to a temperature at which the source material is decomposed, e.g., 200° C. within the temperature range T3. While the wafer W is heated from the gaseous state temperature range T2 to the decomposition temperature range T3, a small amount of the source gas may remain in the processing chamber 21 to be decomposed by a chemical reaction on the surface of the wafer W, and this may result in slight deposition of a copper film 60 on the surface of the wafer W. However, a thickness thereof is extremely thin compared to that of a copper film 60 to be formed in a following step S65, so that no problem is caused thereby.

If the film quality of the copper film 60 slightly formed on the wafer W in the step S64 is poor, the processing chamber 21 may be exhausted, before the step S64, by exhausting the source gas slightly remaining in the processing chamber 21.

(Step S65: Desorption Step)

Figure 8C:
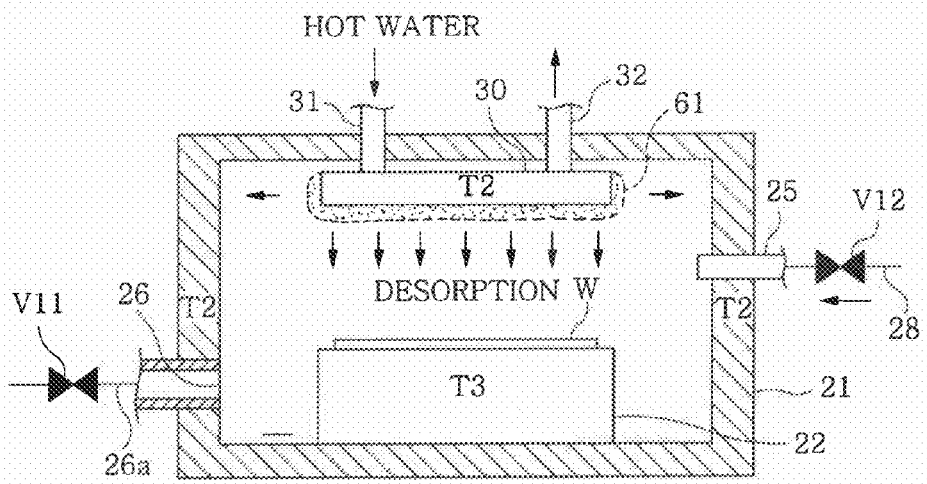

Next, the temperature of the adsorption/desorption member 30 is controlled to a temperature of, e.g., 90° C. within the gaseous state temperature range T2. As a consequence, the source material adsorbed onto the adsorption/desorption member 30 in the step S63 is desorbed from the adsorption/desorption member 30 by sublimation (to a gas phase) and diffused in the processing chamber 21, as shown in FIG. 8C.

At this time, the valves V11 and V12 are closed, and the inside of the processing chamber 21 is in a sealed state (closed space). Hence, the source gas is uniformly diffused with high concentration in the processing chamber 21. In other words, in a conventional CVD apparatus, a gas flow is formed by exhausting the processing chamber 21 while supplying a large amount of source gas into the processing chamber 21. However, such gas flow is not generated in the processing chamber 21 unlike in the conventional CVD apparatus, so that the source gas is uniformly and quickly diffused into the processing chamber 21.

As depicted in FIG. 9A, the source gas that has reached the surface of the wafer W is decomposed by the heat from the wafer W in accordance with the above-described chemical reaction formula (1) to produce copper, which leads to generation of a copper film 60 on the wafer W. In this process as well, the concentration of the source gas near the wafer W decreases due to the decomposition thereof, and the source gas flows sequentially toward the surface of the wafer W. Therefore, by maintaining this state for a predetermined period of time, e.g., about 60 second, the copper film 60 having a film thickness of, e.g., 1 μm, is formed at a high film forming rate.

(Step S66: Readsorption Step)

As shown in FIG. 7, the decomposition of the source material (film formation) is stopped by controlling the temperature of the wafer W to a temperature within the gaseous state temperature range T2 again. Further, the temperature of the adsorption/desorption member 30 is controlled to a temperature within the solid state temperature range T1 again by supplying water from the low temperature controller 41 into the adsorption/desorption member 30. As a consequence, unreacted source gas remaining in the processing chamber 21 which has not reacted in the step S65 is sublimated again and adsorbed as the adsorption film 61 onto the adsorption/desorption member 30, as shown in FIG. 9B. Thus, the gas remaining in the processing chamber 21 mainly includes nitrogen gas as a carrier gas, water (steam), and carbon dioxide gas as a reaction product gas produced by the decomposition of the source material.

(Step S67: Step of Exhausting a Reaction Product Gas)

As described in FIG. 9C, nitrogen gas whose temperature is within the gaseous state temperature range T2 is supplied from the carrier gas source 52 into the processing chamber 21 via the bypass line 54 and the source material supply line 28 and the atmosphere in the processing chamber 21 is replaced with the nitrogen gas while opening the valve V11. Or, nitrogen gas whose temperature is within the solid state temperature range T1 may be directly supplied into the processing chamber 21 via a nitrogen gas supply line (not shown). The supply of nitrogen gas described above may be carried out by cyclic purge of repeating supply and exhaust of nitrogen gas or the cycle purge may be added after the continuous supply of nitrogen gas. In the step S66, the unreacted source material is readsorbed onto the adsorption/desorption member 30, so that the exhausted gas mainly includes nitrogen gas, carbon dioxide and water. Further, the processing chamber 21 may be vacuum-exhausted without the supply of nitrogen gas.

(Step S68: Repetition)

The film formation is performed basically by repeating one or more cycles of the steps S63 (adsorption step) to the steps S67 (step of exhausting a reaction product gas) until the thickness of the copper film 60 formed on the surface of the wafer W becomes a predetermined film thickness, e.g., 2 μm. Or, if the amount of unreacted source gas remaining during the film formation in the step S65 (desorption step) is large enough, one or more cycles of the steps S64 (desorption step) to the steps S67 (step of exhausting a reaction product gas) are repeated.

In accordance with the above-described embodiment, in order to form a film by causing a chemical reaction of the source gas on the wafer W, the source gas is supplied into the processing chamber 21 and is adsorbed in a solid or a liquid state onto the adsorption/desorption member 30. Next, the supply and the exhaust of the source gas in the processing chamber 21 are stopped, and the processing chamber 21 becomes a sealed space. Thereafter, the wafer W is heated to a temperature at which the source gas chemically reacts within a temperature range T3, and the source material is desorbed.

Accordingly, the film formation is performed at a proper temperature in the processing chamber, which is the sealed space where a large amount (high concentration) of the source gas is uniformly diffused. Therefore, by maintaining this state, a desired film thickness is obtained, and a uniform thin film having no impurities can be obtained at a high film forming rate. Moreover, the supply and the exhaust of the source gas are stopped during the film formation, and the source gas is adsorbed onto the adsorption/desorption member 30 before exhausting the reaction product gas produced by the chemical reaction. Hence, the use efficiency of the source material increases considerably, and the high-priced source gas can be effectively used.

When the wafer W is heated to a temperature within the thermal decomposition temperature range T3, the source gas is adsorbed in a solid or a liquid state onto the adsorption/desorption member 30, and thus the amount of the source gas that comes into contact with the wafer W during the temperature increase can be reduced considerably. Accordingly, the deterioration of the film quality by insufficient thermochemical reaction of the source gas can be suppressed.

Moreover, for example, as will be described later, only a source gas of high concentration can be supplied into the processing chamber 21 without supplying a carrier gas together, and further, a large amount of source gas can be adsorbed onto the adsorption/desorption member 30 and, accordingly, a thick film can be formed by a single film forming cycle. A film thickness of a film formed by a single film forming process can be controlled with high accuracy by controlling the adsorption amount of the source material onto the adsorption/desorption member. Further, a film thickness of a thin film can be controlled with high accuracy by controlling a film thickness obtained by a single film forming cycle and a number of repetitions of the film forming cycle.

Meanwhile, as in the film forming apparatus 20 of the present invention, if film formation in a conventional CVD apparatus is performed in the processing chamber 21 while maintaining therein as a sealed space, the source gas remains in a gas state in the processing chamber 21, and thus most of the source gas chemically reacts during the temperature increase of the wafer W. As a result, the copper film 60 with a large amount of impurities is obtained. The repetition of the film forming cycle only leads to the lamination of the copper film 60, which contains a large amount of impurities. Further, since the concentration of the source gas is in the ppm-levels, the thickness of the copper film 60 is extremely thin. The film forming cycle needs to be repeated many times, thereby decreasing a throughput.

When the copper film 60 of a desired film thickness is obtained by a single film forming process, the step S68 can be omitted. Moreover, when most of the source gas is consumed to form the film in the step S65 and the amount of unreacted source gas remaining in the processing chamber 21 is small, the readsorption of the source material in the step S66 may not be required.

In the above-described embodiment, the carrier gas and the source gas are supplied into the processing chamber 21. However, the film formation can also be performed without the supply of the carrier gas. In that case, the source gas is supplied into the processing chamber 21 at a predetermined flow rate through the baking line 28b, however, the film formation is carried out in the same manner as the above-described film forming method, so that the same effects can be obtained.

In the above example, there is described the film forming system in which the vacuum exhaust unit 26b is provided in the exhaust line 26a. However, the vacuum exhaust unit 26b may not be provided. In that case, the film forming system includes the source material supply unit 50 having an inner pressure slightly higher than an atmospheric pressure due to, e.g., sublimation of the source material, the film forming apparatus 20 having an inner pressure switched between the pressure slightly higher than the atmospheric pressure and the atmospheric pressure, and an exhaust line of the atmospheric pressure, in which an exhaust fan is installed.

At this time, the step S61 of exhausting the processing chamber is omitted. Further, in the adsorption step S64, the source gas is supplied into the processing chamber 21 via the baking line 28b. In the step S67 of exhausting a reaction product gas, an inert gas, e.g., nitrogen gas or the like, of a positive pressure is supplied into the processing chamber 21, and the reaction product gas in the processing chamber 21 is replaced with the inert gas.

Figure 10:
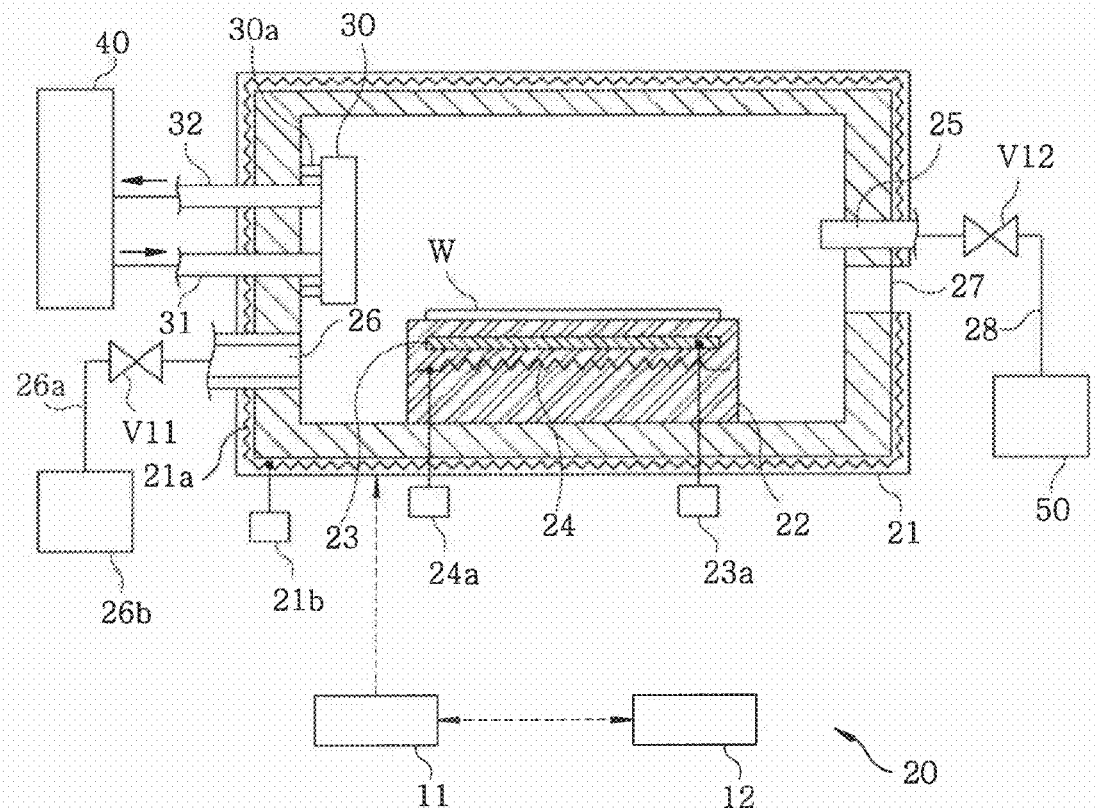
FIG. 10 is a vertical cross sectional view of another example of the film forming apparatus for performing the film forming method.

In the above example, the adsorption/desorption member 30 is provided at the upper portion of the processing chamber 21 so as to face the wafer W. However, it may also be provided at, e.g., the side of the processing chamber 21, as shown in FIG. 10. In this film forming apparatus 20 as well, the film formation is performed in the same manner, so that the same effects can be achieved.

As long as the source gas can be sublimated and adsorbed in a solid state onto the adsorption/desorption member 30, the adsorption/desorption member 30 can be located at any position three-dimensionally. For example, the size of the adsorption/desorption member 30 can be reduced by increasing its surface area onto which the source gas is adsorbed. Accordingly, the space-saving effect can be achieved and, the shape of the processing chamber 21 can be freely designed.

Moreover, when it is difficult for the source material to be adsorbed onto the adsorption/desorption member 30 depending on types of source materials, it is possible to condense the source material in a liquid state, as previously described. In that case, the temperature control medium may flow on the bottom surface of the processing chamber 21 to surround the mounting table 22 so that the source material is condensed on the bottom surface of the processing chamber 21 near the mounting table 22 and, also, the bottom surface of the processing chamber 21 serves as the adsorption/desorption member 30. Or, if liquid droplets are adsorbed thereonto without being dropped on the wafer W, the adsorption/desorption member 30 may be disposed so as to face the wafer W.

Figure 11:
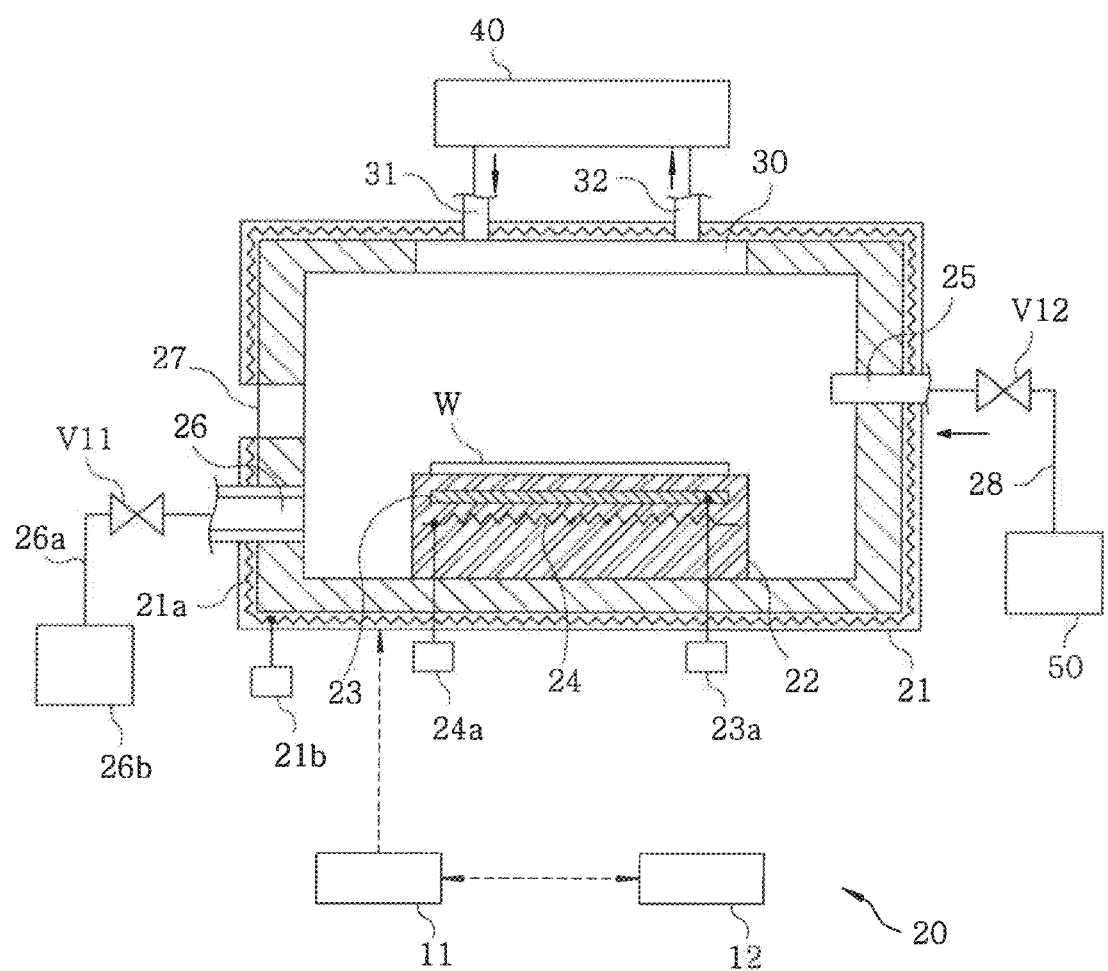
FIG. 11 offers a vertical cross sectional view of still another example of the film forming apparatus for performing the film forming method.

As shown in FIG. 11, the adsorption/desorption member 30 may serve as the inner wall of the processing chamber 21.

What is claimed is:

1. A film forming method for forming a thin film on a substrate by causing a chemical reaction of a source gas produced from a solid or a liquid source material on a surface of a substrate in a processing chamber by using a film forming apparatus including a processing chamber having a supply port for supplying the source gas and a exhaust port for exhausting a gas, a mounting table which is disposed in the processing chamber and mounts thereon the substrate, and an adsorption/desorption member for adsorbing and desorbing the source gas by changing a surface temperature thereof, the film forming method comprising the steps of:
   (a) setting a temperature of an inner wall of the processing chamber higher than or equal to a temperature TA at which the source material is sublimated or evaporated and lower than a temperature TB at which a chemical reaction takes place on the surface of the substrate;
   (b) setting a surface temperature of the adsorption/desorption member lower than the temperature TA, supplying the source gas into the processing chamber through the supply port while closing the exhaust port, and adsorbing the source gas in a solid or a liquid state onto the surface of the adsorption/desorption member while closing the supply port;
   (c) setting a temperature of the substrate mounted on the mounting table in the processing chamber higher than or equal to the temperature TB, setting the surface temperature of the adsorption/desorption member higher than or equal to the temperature TA, and causing a chemical reaction of the source gas desorbed from the surface of the adsorption/desorption member on the surface of the substrate to form a film on the substrate; and
   (d) replacing the source gas in the processing chamber with a purge gas.

2. The film forming method of claim 1, further comprising, before the step (b), a step of mounting the substrate on the mounting table in the processing chamber and setting a temperature of the substrate higher than or equal to the temperature TA and lower than the temperature TB.

3. The film forming method of claim 1, further comprising, after the step (d), a step (d1) of setting the temperature of the substrate higher than or equal to the temperature TA and lower than the temperature TB, wherein one or more cycles including the step (b), the step (c), the step (d) and the step (d1) are repeated.

4. The film forming method of claim 1, further comprising, between the step (c) of film formation and the step (d) of replacement, a step of setting the surface temperature of the adsorption/desorption member lower than the temperature TA and adsorbing unreacted source gas in the processing chamber in a solid or a liquid state onto the adsorption/desorption member.

5. The film forming method of claim 1, wherein the source gas is supplied into the processing chamber together with one or more carrier gases selected from argon, nitrogen, hydrogen.

6. A film forming apparatus for forming a thin film on a substrate by causing a chemical reaction of a source gas produced from a solid or a liquid source material on a surface of the substrate, the film forming apparatus comprising:
   a processing chamber having a supply port for supplying the source gas and an exhaust port for exhausting a gas;
   an adsorption/desorption member for adsorbing and desorbing the source gas by changing a surface temperature thereof;
   a first temperature control unit for setting a temperature of an inner wall of the processing chamber;
   a second temperature control unit for setting a temperature of the substrate in the processing chamber;
   a third temperature control unit for setting a temperature of a surface of the adsorption/desorption member;
   a purge gas supply unit for supplying a purge gas into the processing chamber; and
   a control unit controlling the film forming apparatus,
   wherein the control unit performs:
   setting a temperature of an inner wall of the processing chamber higher than or equal to a temperature TA at which the source material is sublimated or evaporated and lower than a temperature TB at which a chemical reaction occurs on the surface of the substrate by the first temperature control unit;
   setting a surface temperature of the adsorption/desorption member lower than the temperature TA by the third temperature control unit, supplying the source gas into the processing chamber through the supply port while closing the exhaust port, and adsorbing the source gas in a solid or a liquid state onto the surface of the adsorption/desorption member while closing the supply port;
   setting a temperature of the substrate mounted on the mounting table in the processing chamber higher than or equal to the temperature TB by the second temperature control unit, setting the surface temperature of the adsorption/desorption member higher than or equal to the temperature TA and lower than the temperature TB by the third temperature control unit, and causing a chemical reaction of the source gas desorbed from the surface of the adsorption/desorption member on the surface of the substrate to form a film on the substrate; and
   replacing the source gas in the processing chamber with a purge gas.

7. The film forming apparatus of claim 6, wherein the control unit performs mounting the substrate on the mounting table in the processing chamber before the source gas is adsorbed onto the surface of the adsorption/desorption member, and outputs a control signal to set the temperature of the substrate higher than or equal to the temperature TA and lower than the temperature TB by the second temperature control unit.

8. The film forming apparatus of claim 6, wherein the control unit performs to repeat, after the thin film is formed, one or more cycles including:
   setting the temperature of the substrate higher than or equal to the temperature TA and lower than the temperature TB by the second temperature control unit, setting the surface temperature of the adsorption/desorption member lower than the temperature TA by the third temperature control unit, supplying the source gas into the processing chamber through the supply port while closing the exhaust port, adsorbing the source gas in a solid or a liquid state onto the surface of the adsorption/desorption member while closing the supply port, setting a temperature of the substrate mounted on the mounting table in the processing chamber higher than or equal to the temperature TB by the second temperature control unit, setting the surface temperature of the adsorption/desorption member higher than or equal to the temperature TA and lower than the temperature TB by the third temperature control unit, causing a chemical reaction of the source gas desorbed from the surface of the adsorption/desorption member on the surface of the substrate to form a thin film on the substrate, and replacing the source gas in the processing chamber with a purge gas.

9. The film forming apparatus of claim 6, wherein the control unit performs, between the thin film formation and the replacement of the source gas with the purge gas, setting the surface temperature of the adsorption/desorption member lower than the temperature TA by the third temperature control unit to adsorb unreacted source gas in the processing chamber in a solid or a liquid state onto the adsorption/desorption member.

10. A non-transitory storage unit which stores therein a computer program for driving a computer to perform a film forming method for forming a thin film on a substrate by causing a chemical reaction of a source gas produced from a solid or a liquid source material on a surface of a substrate in a processing chamber by using a film forming apparatus including a processing chamber having a supply port for supplying the source gas and a exhaust port for exhausting a gas, a mounting table which is disposed in the processing chamber and mounts thereon the substrate, and an adsorption/desorption member for adsorbing and desorbing the source gas by changing a surface temperature thereof, the film forming method including the steps of:
   (a) setting a temperature of an inner wall of the processing chamber higher than or equal to a temperature TA at which the source material is sublimated or evaporated and lower than a temperature TB at which a chemical reaction takes place on the surface of the substrate;
   (b) setting a surface temperature of the adsorption/desorption member lower than the temperature TA, supplying the source gas into the processing chamber through the supply port while closing the exhaust port, and adsorbing the source gas in a solid or a liquid state onto the surface of the adsorption/desorption member while closing the supply port;
   (c) setting a temperature of the substrate mounted on the mounting table in the processing chamber higher than or equal to the temperature TB, setting the surface temperature of the adsorption/desorption member higher than or equal to the temperature TA, and causing a chemical reaction of the source gas desorbed from the surface of the adsorption/desorption member on the surface of the substrate to form a film on the substrate; and
   (d) replacing the source gas in the processing chamber with a purge gas.

* * * * *